United States Patent [19]

Weber

[11] Patent Number: 4,855,253

[45] Date of Patent: Aug. 8, 1989

[54] TEST METHOD FOR RANDOM DEFECTS IN ELECTRONIC MICROSTRUCTURES

[75] Inventor: Charles M. Weber, Santa Clara, Calif.

[73] Assignee: Hewlett-Packard, Palo Alto, Calif.

[21] Appl. No.: 149,809

[22] Filed: Jan. 29, 1988

[51] Int. Cl.[4] ............................................. H01L 21/66
[52] U.S. Cl. ..................................... 437/8; 324/158 R
[58] Field of Search ........................ 437/8; 324/158 R

[56] References Cited

U.S. PATENT DOCUMENTS

| | | | |
|---|---|---|---|
| 3,808,527 | 4/1974 | Thomas .................................... | 437/8 |
| 3,810,301 | 5/1974 | Cook ....................................... | 437/8 |
| 3,983,479 | 9/1976 | Lee et al. ............................. | 324/158 R |
| 4,144,493 | 3/1979 | Lee et al. ............................. | 324/158 R |
| 4,347,479 | 8/1982 | Cullet ................................. | 324/158 R |
| 4,386,459 | 6/1983 | Boulin .................................. | 437/8 |
| 4,465,973 | 8/1984 | Countryman, Jr. ............. | 324/158 R |
| 4,475,811 | 10/1984 | Brunner ........................... | 324/158 R |
| 4,538,105 | 8/1985 | Ausschnitt ......................... | 437/8 |

OTHER PUBLICATIONS

Mandia et al. "Formation of Kerf Metallurgy on Integrated Semiconductor Circuit Wafers" IBM TDB vol. 14, No. 9, Feb. 1972, pp. 2620-2621.
Alcorn et al., "Kerf Test Structure Design for Process and Device Characterization", Solid State Technology, May 85, pp. 229-235.
W. Lukaszek, W. Yarbrough, T. Walker, J. Meindl, "CMOS Test Chip Design for Process Problem Debugging and Yield Prediction Experiments", Center for Integrated Systems, Stanford University, Stanford, Calif.

Primary Examiner—Brian E. Hearn
Assistant Examiner—Tom Thomas
Attorney, Agent, or Firm—William H. F. Howard

[57] ABSTRACT

A method for testing layering processes of integrated circuit construction for random defects. A test structure is employed having a plurality of micro-patterns covering a wafer, the patterns being fabricated in accord with a unit process of an integrated circuit manufacturing operation. The patterns are fabricated either with a lower conductive level covered by an insulative layer and an upper conductive level, all having pads which may be probed at the upper level, or a single conductive layer. By repeating tests in various unit processes, random defects can be isolated to individual unit processes. Nine patterns are disclosed which form a universal test set.

18 Claims, 4 Drawing Sheets

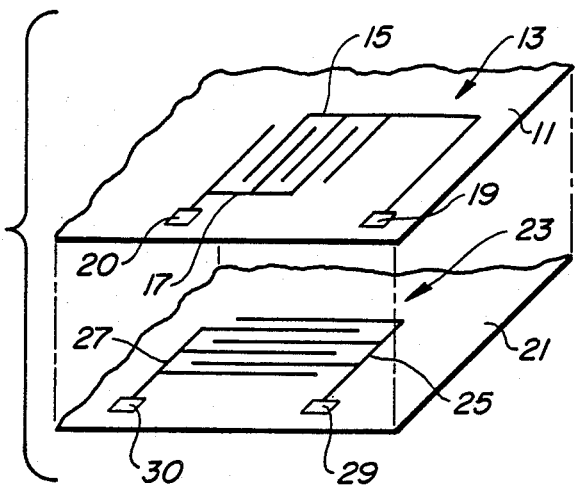
FIG._1.
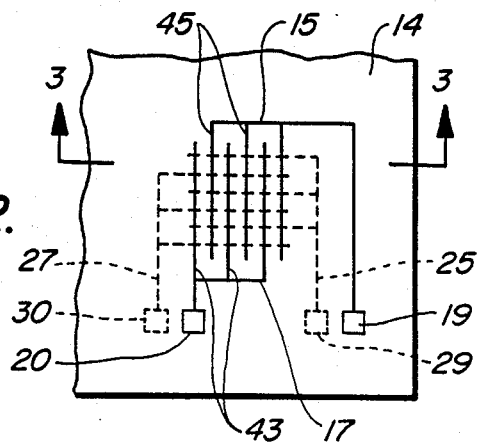
FIG._2.
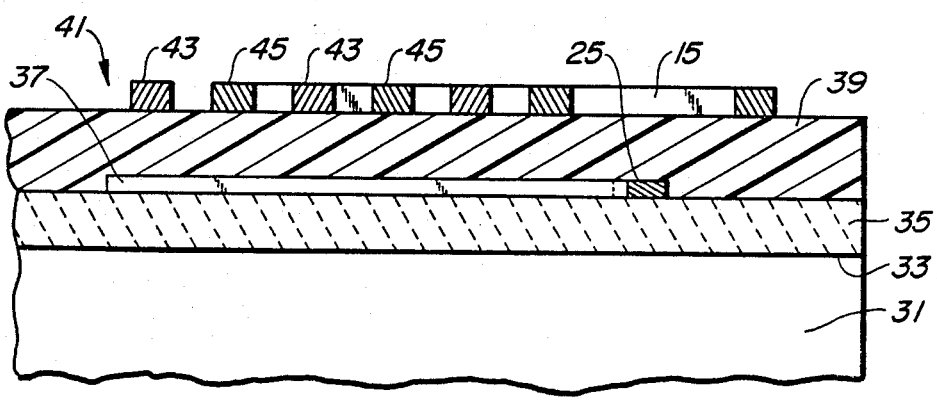
FIG._3.

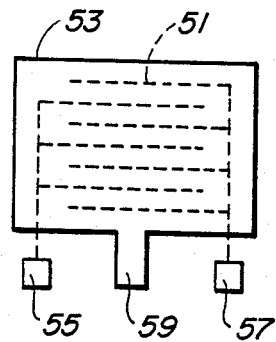
FIG._4a.
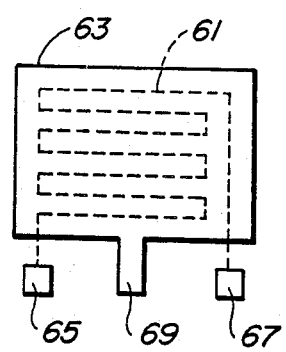
FIG._4b.
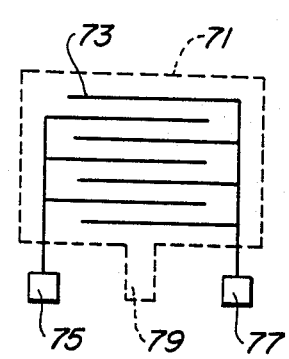
FIG._4c.
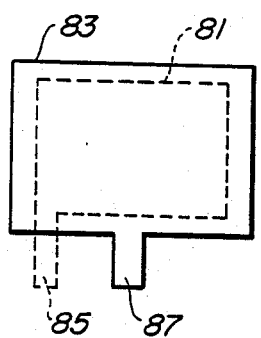
FIG._4d.
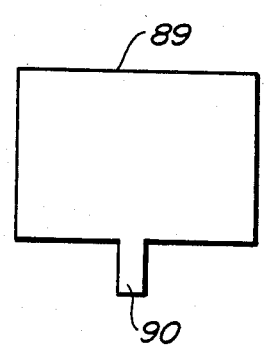
FIG._4e.
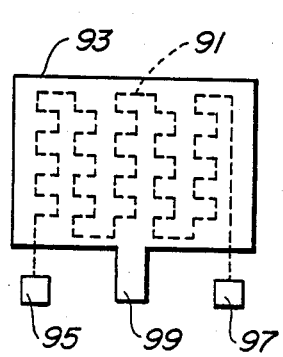
FIG._4f.
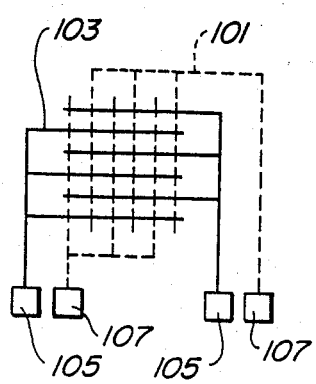
FIG._4g.
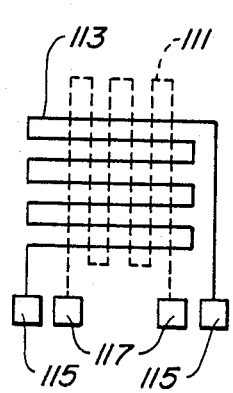
FIG._4h.
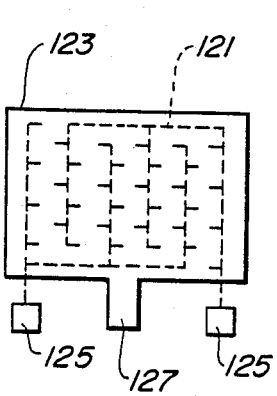
FIG._4i.

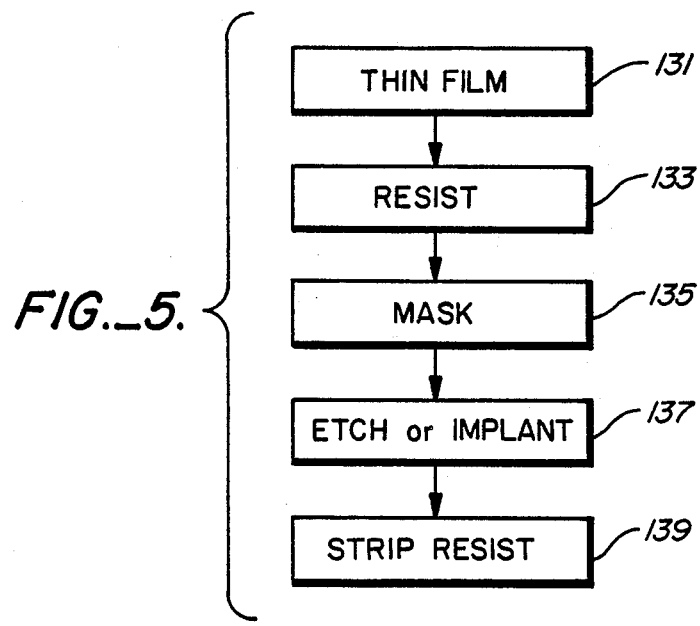
FIG._5.
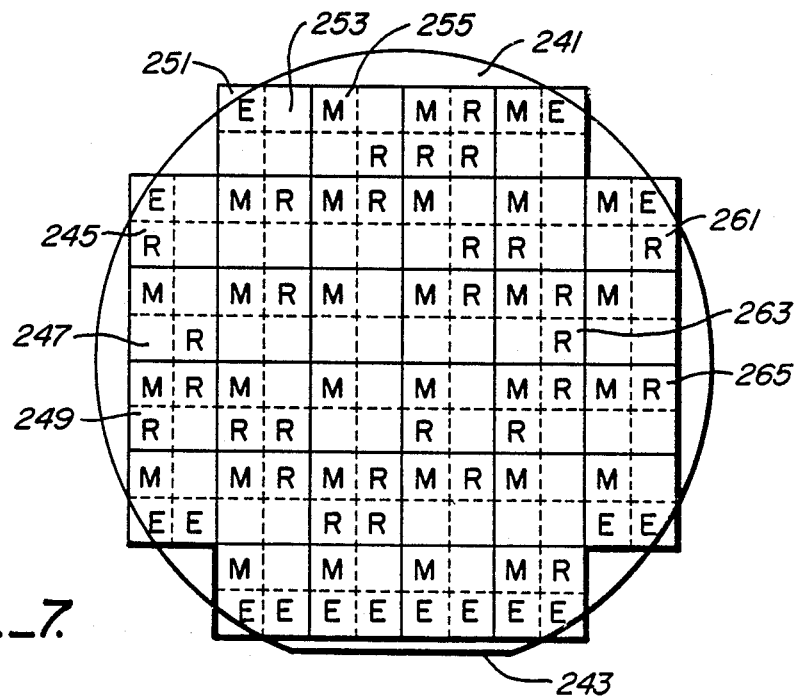
FIG._7.

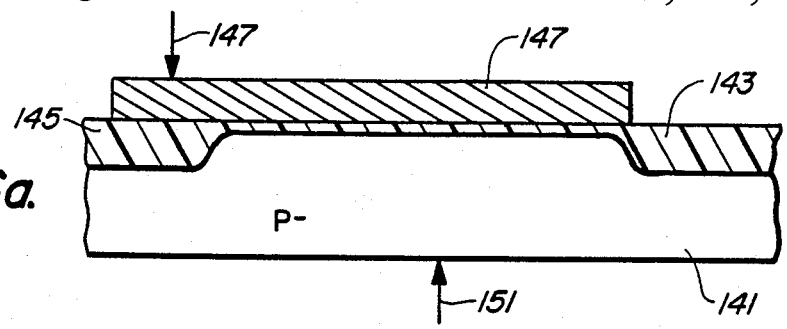
FIG._6a.
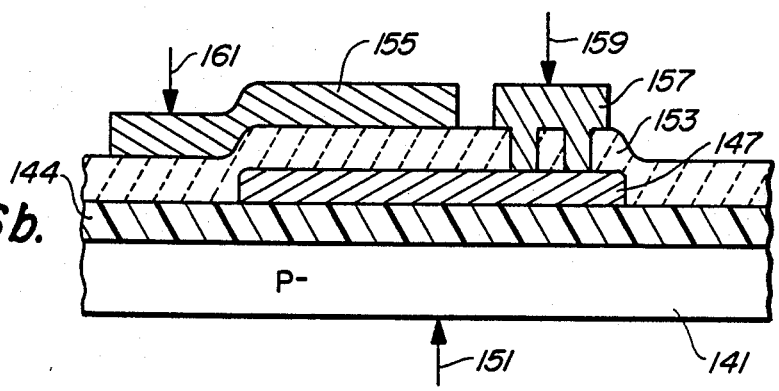
FIG._6b.
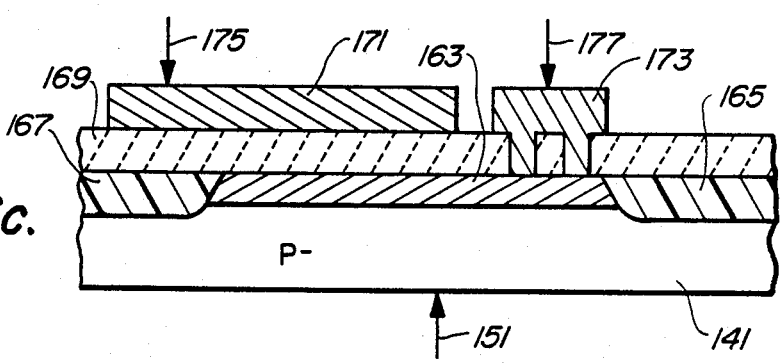
FIG._6c.
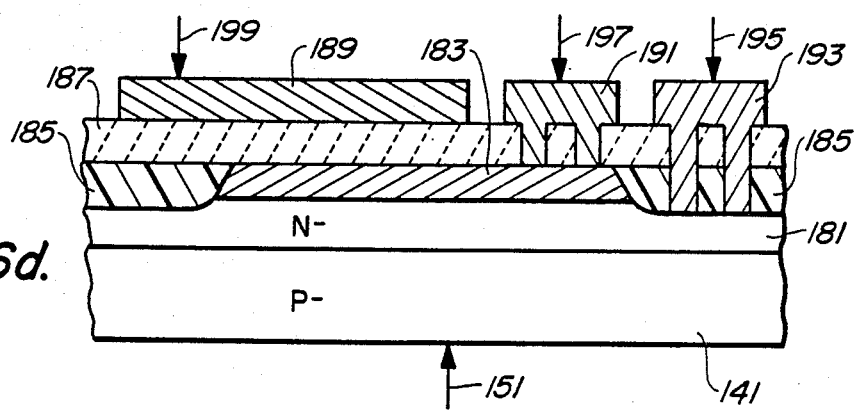
FIG._6d.

TEST METHOD FOR RANDOM DEFECTS IN ELECTRONIC MICROSTRUCTURES

DESCRIPTION

1. Technical Field

The invention relates to testing of integrated circuits for defects and more particularly to patterns of microstructures for testing portions of an integrated circuit manufacturing process.

2. Background Art

In the manufacture of semiconductor integrated circuits, there has always been a loss of chip yield from finished wafers due to various defects, which result in chip failure. One class of defects is known as a systematic defect, observed at the wafer level in recurring spatial patterns of chip failures. Systematic errors can be traced to specific causes. A second class of defects, known as a random defect, cannot be associated with a particular cause for any individual failure. Collectively, the cause of random defects can sometimes be determined experimentally. The present invention is concerned with the latter class of defects occurring during the manufacturing steps of integrated circuit fabrication.

When integrated circuits and wafers were simple, meaning that the layering processes of circuit manufacture could be accomplished in a few days or even a week, random defects could be spotted by allowing wafers to proceed to completion and then testing actual circuits for defects. In the event of circuit failure beyond an expected amount, manufacturing processes could be inspected and changed to the extent necessary to achieve better results. As circuits became more complex, with an accompanying increase in fabrication time, the waiting time before testing means a delay in making corrections. This delay implies wasted effort and financial loss with new batches of wafers introduced into a manufacturing process laden with unacceptable levels of random defects before corrections are made.

One well known approach useful in spotting defects affecting chips on a wafer is the use of test structures placed on a wafer, along with actual chips under construction. Such a test structure is a usually a pattern which can be inspected after circuits are fabricated. Inspection gives clues to the failure mechanisms and allows adjustment of manufacturing steps. In an article entitled "CMOS Test Chip Design for Process Problem Debugging and Yield Prediction Experiments" W. Lukaszek et al. describe various test structures which can be simultaneously fabricated on a wafer to test for various failure modes in chip topography, as well as testing for defect density. In order to adequately test for defect density, it has been previously recognized that a sufficient area is necessary. The greater the test area, the better is the prediction of defect density that can be made.

Of particular interest is the kind of random defect which will cause failure of a circuit by creating a short or open condition. Other defects which have little or no impact on circuit performance are not of interest. Accordingly, an object of the invention has been to find test structures for measuring defects in general, and particularly random defects, in a time shorter than the manufacturing cycle time.

DISCLOSURE OF INVENTION

The above object has been met with the discovery of a random defect test method which is applied to sub-cycles of a manufacturing process, known as unit processes. A unit process consists of application of a thin film or growing of a layer, applying a layer of photoresist, patterning the resist with a mask, etching away undesired portions of the pattern, then stripping the resist. Many unit processes are repeated serially in integrated circuit fabrication. A full integrated circuit fabrication process consists of such unit processes, each realized with different types of films or grown layers Although repetition of identical unit processes is possible, it rarely occurs. The test pattern of the present invention is applied to one or more unit processes so that these sub-cycles are individually evaluated to determine whether the random error occurrences exceed an expected amount.

The test pattern covers most of the surface of the wafer and consists of subpatterns distributed in a manner resembling the distribution of integrated circuits upon similar size wafers. Usually the subpatterns are formed by a step-and-repeat camera, with the subpattern being equal in size to the stepper field. Within the stepper field is a plurality of die-size patterns. Within the die size patterns are smaller micro-patterns, simulating a portion of a layer of an integrated circuit chip by having a pair of conductive, spaced-apart layers, for example wiring patterns, separated by a dielectric layer. The pattern is actually fabricated in a unit process. Because the stepper repeats the pattern over the surface of a wafer, systematic defects, particularly mask induced repeat defects, as well as wafer edge induced failures, may be easily spotted. After subtracting these defects from the total, the remaining defects are classified as random defects. Further analysis may identify remaining systematic components of the defect distribution.

A particularly useful set of nine micro-patterns has been found. Generally, these consist of upper and lower wiring patterns for the conductive layers, but in one case the pattern consists of a single conductive plate. These micro-patterns have been found to be sufficient for testing most unit processes.

A wafer carrying selected micro-patterns may be used to test a unit process of an integrated circuit manufacturing process, either alone or as part of a test batch or as part of a production run. Random defects arising in a unit process may be inspected by probing the test wafer, looking for shorts or opens in the test structure.

An advantage of the present invention is that individual unit processes may be tested, thereby compressing the time for diagnosing a faulty unit process. A second advantage is that a sufficient area on a wafer is now used for a significant sampling of random defects. Still a further advantage is that random defects may be separated from mask induced defects, as well as edge induced defects.

BRIEF DESCRIPTION OF THE DRAWINGS

FIG. 1 is a perspective view of portions of reticle plates carrying wiring patterns for forming conductive layers of a micro-pattern in accord with the present invention.

FIG. 2 is a top view of the patterns of FIG. 1 manufactured on a portion of a wafer using a unit process.

FIG. 3 is a partial side cutaway view of the wafer portion of FIG. 2 taken along lines 3—3.

FIGS. 4a–4i are top plan view of a set of conductive layers, forming micro-patterns in accord with the present invention.

FIG. 5 is a diagram of steps comprising a unit process for manufacturing semiconductor integrated circuits.

FIGS. 6a–6d are side views of typical unit processes of FIG. 5 implementing micro-patterns of the present invention.

FIG. 7 is a top plan view of a wafer having test patterns in accord with the present invention, processed with a unit process, and exhibiting various defects.

BEST MODE FOR CARRYING OUT THE INVENTION

With reference to FIG. 1, a representative micro-pattern is shown prior to formation on a wafer. The micro-pattern exists on upper and lower reticle plates 11 and 21. Reticle plate 11 carries wiring layout 13. The wiring layout is termed a double vertical comb because of its comb-like members 15 and 17 which extend into each other, without contact. The names for the layouts and structures herein, such as double vertical comb, are arbitrary descriptive names. These structures, individually, have been previously built by others and called by different names. The present invention involves a test pattern employing groups of these structures for testing unit processes.

The reticle is a mask for patterning a film on a wafer. Reticle plate 21 is a separate mask to be used in the same unit process, but in a different layer. The structure thereon is described as a double horizontal comb consisting of comb members 25 and 27. Each comb member has fingers which extend into corresponding fingers of an opposite member but do not contact each other. It should be realized that the reticles 11 and 21 are greatly simplified in the drawings. In actuality, the number of fingers in each member would be several dozen or more. The line width of the fingers simulates line widths in a unit process being tested. Similarly, the spacing between lines also simulates spacing in the same unit process. It will be seen that each conductor is terminated in a pad. In the upper vertical comb 13, pads 19 and 20 terminate the conductors, while in the lower pattern 23 the conductive patterns terminate in pads 29 and 30. These pads will be used for contact points for wire probes testing for shorts and opens in the pattern.

With reference to FIG. 2, a wafer portion 14 incorporates the micro-pattern shown in FIG. 1 with lower wiring layout 23 seen in dashed lines and upper wiring layout 13 seen with solid lines. One wiring layout overlies the other with an insulating layer therebetween. The structure mimics wires and insulation therebetween fabricated within a unit process of a semiconductor manufacturing operation. The insulating layer is typically a layer of silicon dioxide or silicon nitride.

In the side view of FIG. 3, a wafer substrate layer 14 is shown, over which the conductive wire layers of FIG. 2 may be formed. The substrate is typically silicon having a planar upper surface 33 over which an insulating oxide layer 35 is formed. Such a layer may be thermal oxide having a thickness sufficient to insulate a first metal layer 37 from the substrate. The first metal layer corresponds to the lower conductive double comb of FIG. 2. Over the first metal layer, a dielectric layer is formed, insulating the lower metal layer from the superposed upper metal layer 41. This layer may be seen to have comb fingers 43 and 45 and so on.

Thus far, there has been discussion of a single test structure. However, single test structures are known in the prior art. The present invention employs a test pattern with a multiplicity of test structures disposed over the entirety of a wafer. The test pattern may repeat the same or different test structures. In accord with the present invention, a plurality of microstructures has been found which will test most defects which occur in integrated circuit manufacturing. The structures are useful for testing almost any integrated circuit manufacturing process. The very same structures can be used to test a wide diversity of processes by testing individual unit processes within an overall process. The nine microstructures are illustrated in FIGS. 4a–4i. These particular structures were devised because unwanted shorts in conducting layers usually occur on the perimeter of a conducting line or at a corner. Unwanted opens appear either at corners or within the line. Unwanted shorts in inter-layer dielectrics usually occur from the perimeter or the corner of the feature in the conducting layer above the dielectric to a similar feature in the conductor beneath the dielectric. Interlayer dielectric breakdown can also occur in conjunction with planar structures.

The micro-patterns of FIGS. 4a–4i are micro-pattern plans which first exist as a mask set for patterning wafers in a unit process, then exist within a wafer. With reference to FIG. 4a a horizontal double comb 51 is illustrated overlying a plate 53 and separated therefrom. Plate 53 is an areawise conductive layer layout. The double comb of 51 is similar to the double comb 23 in FIG. 1. Opposed comb fingers extend toward each other, but do not touch on a single plate above a plane on which plate 53 is fabricated. It will be seen that the double horizontal comb 51 has probe contacts 55 and 57 while the lower plate 53 has a pad 59.

The patterns of FIGS. 4a–4i are treated in the same manner as circuit designs for building integrated circuits. The patterns are first laid out on film and transferred to reticle masks. The reticle masks are then used to pattern layers in unit processes as will be explained below in further detail. The patterns shown are greatly simplified and in practice, many more lines of the type shown would be drawn.

In FIG. 4b, a horizontal raster wiring layout 61 is disposed under a plate 63 with a dielectric layer intended to be placed therebetween. Once again, two reticles, a lower reticle containing layout 61 and an upper reticle containing layout 63 are used to form generally planar spaced-apart layers in a unit process of a semiconductor manufacturing operation. Once the operation is complete, electrical probe wires contact pads 65 and 67 of the lower layer and 69 of the upper layer for testing.

In FIG. 4c, the lower plate 71 is seen to be a planar conductive plate, while the upper reticle is a double horizontal comb 73. Plate structures are particularly adapted for testing area-wide conductivity through an intervening dielectric layer to the adjacent metal layer. Comb patterns are particularly adapted to testing bridging types of shorts, while raster patterns are adapted for testing continuity.

With reference to FIG. 4d, a pair of planar conductive plates are to be made. Plate 81 lies under plate 83 with dielectric material therebetween. The plates have respective contact pads 85 and 87. The only micro-pattern having only a single layer is shown in FIG. 4e where the area plate 89 is intended to overlie an insulator so that tests can be performed relative to a substrate having a covering insulative layer. Contact pad 90 is used by an electrical probe making contact with plate 89.

FIG. 4f shows a vertical serpentine pattern 91 under an overlying plate 93. The serpentine pattern has a large number of corners and is particularly adapted for testing corner continuity. Pads 95 and 97 are used by electrical probes for lower layout 91 while contact pad 99 is used by the upper plate.

With reference to FIG. 4g a double vertical comb is seen underlying a double horizontal comb. Pads 105 make contact with the upper layer, while pads 107 make contact with the lower layer.

In FIG. 4h, a vertical raster 111 is seen to underlie a horizontal raster 113. Pads 115 are used for probing upper layout 113, while pads 117 are used for probing the lower layout. In order to probe the lower layer in a fabricated structure, vias must be constructed in a unit process so that contact is actually made from an upper level through the intervening dielectric material to the lower layer. This applies to all lower level patterns. While only a few probe pads are shown, in practice it is desirable to fabricate a pair of pads per terminal in order to test for prober contact.

In FIG. 4i a double vertical digitated layout 121 is disposed under plate 123. The lower layout 121 has contact pads 125 while the upper layout has a contact pad 127. The double verticle digitated pattern is particularly adapted for testing corner bridging defects. No other pattern shown has this test capability. Additionally, the pattern of FIG. 4i can test for other defects occurring between the upper plate 123 and the lower layout 121. The nine micro-patterns of FIGS. 4a–4i may be used in various combinations and on different or the same wafers to test a unit process.

Each unit process in a semiconductor manufacturing operation may be characterized by the steps illustrated in FIG. 5. The first step is the deposition of a thin film 131. Such a thin film may be either an insulator or a conductor which is patterned. Such patterning is accomplished by application of a resist layer 133 over which a pattern is established with a mask 135. After patterning, portions of the thin film layer are etched away while other portions are saved. The remaining resist is stripped in step 139 and then the process is repeated with the next thin film layer which is deposited over the underlying structure. Implants may also be performed. The unit process is repeated again and again, more than a dozen times, with different thin films until an integrated circuit structure is complete. During each of the unit process procedures there is an opportunity for random defects, as well as other types of defects. The test structures of the present invention are particularly useful for isolating random defects.

In FIG. 6a, a first embodiment of a unit process is shown. A silicon substrate 141 has been patterned to remove side regions 143 and 145. The removed side regions have been filled with a thin film layer of oxide, known as field oxide, applied over the substrate. A conductive polysilicon layer 147 is applied over the oxide layer as a plate pattern similar to that shown in FIG. 4e. Arrow 149 represents an electrical probe to conductive polysilicon layer 147 to test for shorts with respect to the underlying substrate 141 where a probe is applied at arrow 151.

With reference to FIG. 6b the substrate layer 141 again has a layer of insulative oxide 144 which is unpatterned. However, a patterned conductive polysilicon layer 147 is disposed over the oxide layer. The polysilicon layer 147 is a first micro-pattern of a particular selected type. This pattern is covered by a dielectric layer 153 covered by the metal layer 155, forming a second conductive layer. In this situation, unit processes to be tested include the unit process for building the polysilicon layer 147, the unit process for building dielectric layer 153 with via holes therein and the unit process for building metal layer 155. A conductive via 157 extends through the dielectric layer 153 for probing polysilicon layer 147. Tests may be made with probe 159 contacting via structure 157, probe 161 contacting metal layer 155 and probe 151 contacting the substrate. Tests may be made between the substrate and polysilicon layer 147 and between polysilicon layer 147 and a metal layer 161. Via holes are made with non-critical auxiliary projection aligner plates, or non-critical stepper reticles. Non-critical means only containing geometries much larger than minimum geometries.

The test structure of FIG. 6c resembles a portion of a transistor in which a p-type substrate 141 has an n+ diffused conductive region 163 between oxide regions 165 and 167. The conductive n+ region 163 may be a source or drain electrode for a MOS or CMOS transistor. The electrode is covered by a dielectric layer 169 which is in turn covered by a metal layer 171, which may simulate a gate electrode. A conductive via 173 extends through via openings to the lower conductive layer 163. The lower conductive layer may be fabricated in a wiring pattern similar to any of the patterns shown in FIGS. 4a–4i with a corresponding upper layer 171. Testing by means of a probe 175 contacting the upper metal layer and a probe 177 to the conductive via will test the unit process used for forming the dielectric layer 169. Tests between the conductive via 177 and a probe 151 contacting the substrate will test the fabrication of the unit process involving the formation of the n+ region 163.

Still another example is given in FIG. 6d where the p-type substrate 141 has an n-well region 181. N-wells in P-substrates are used to make CMOS transistors. Within the N-well is a conductive p+ region 183 insulated by lateral oxide regions 185. Over the conductive p+ region is a dielectric layer 187 which, in turn, is covered with a conductive metal layer 189. Conductive vias 191 and 193 extend through dielectric layer 187 so that both the n-well layer 181 and the conductive p+ layer 183 may be probed. Layers 183 and 189 are patterned in accord with selected patterns of FIGS. 4a–4i. An electric probe wire 195 is applied to via 193 to test the n-well layer 81 with respect to substrate 141 by means of electrical probe 151, or to test n-well layer 181 with respect to conductive p+ layer 183 which is probed by means of electrical wire probe 197. In turn, the conductive p+ layer 83 may be tested with respect to the overlying metal layer 189 which may be probed with electrical probe 199. Various other tests may be made using the electrical probe, such as tests of resistance and capacitance in accord with usual procedures. Each patterned layer of FIG. 6d has been constructed in accord with a unit process which may be tested by making conductive layers conform to the micro-patterns of FIGS. 4a–4i.

FIG. 7 illustrates the manner of separation of random defects from systematic defects using micro-patterns of the present invention. Quite simply, recurring defects are always systematic. The wafer 241 may be a silicon wafer of any size with one or more flat spots 243 used for orientation and handling purposes. In integrated circuit fabrication a step-and-repeat camera applies patterns to the wafer. This camera, known as a stepper, has an exposure field which is indicated by the boundaries of the dark squares 245, 247, 249 and so on. In FIG. 7, 32 dark squares are shown, but any number may be used, depending on the size of the wafer and the stepper field. Each stepper field has a number of die patterns, called sub-patterns, each die pattern corresponding to a single integrated circuit pattern to be fabricated. However, in accord with the present invention, micro-patterns of the type shown in FIGS. 4a-4i are contained within die patterns. These micro-patterns in an arrangement comprise a die pattern. Several die patterns comprise a stepper field. The entirety of the stepper patterns form a test pattern.

The wafer 241 is usually patterned first with the lower reticle patterns, then covered with a thin film of insulating material and then patterned with the upper reticle pattern. Once patterning is complete in a unit process the test structures are probed as previously described. FIG. 7 indicates the distribution of defects for a typical probed wafer. The die size areas bounded by dashed lines contain individual test structures. Some of the die size areas have letters therein. A letter over a structure indicates a structure failure after electrical probe tests. A failure is defined by tests within automatic test apparatus, connected to the probe wires, and not part of this invention. The test apparatus frequently measures electrical properties such as conductivity, resistivity, capacitance, opens and shorts. For example, the die size area 251 containing the letter "E" indicates that an edge induced defect exists in one of the microstructures at that location. An adjacent die size pattern 253 contains no letter and thus has no defect in any microstructure. The next die size pattern 255 contains a letter "M" indicating that a mask-type defect occurs. Since the mask defect is produced by a stepper, it will be seen that all patterns in the upper left quadrant of the stepper field have the same mask associated defect. In fact the recurrence of a defect over the test pattern in the same location has created the inference of the mask defect, rather than inspection of the structure. Similarly, defects recurring along an edge of the pattern which are not mask related defects are identified as edge induced defects. After separation of these defects, the remaining defects are then random defects, identified by the letter "R", such as in the microstructures 261, 263 and 265. Thus, by repeating the micro-patterns with a stepper over substantially the entirety of a wafer surface, i.e. more than 85% of the surface, various types of systematic defects may be identified and separated from the remaining defects which are then identified as random defects. Random defects should follow Poisson's relation which predicts defect densities for random failures. If the defect distribution does not follow Poisson's relation, a non-random component exists. It has been found that after all repeating edge and reticle defects have been eliminated, the distribution of remaining defects appears random on most wafers.

I claim:

1. A method of testing an integrated circuit manufacturing process, which comprises a sequence of unit processes, for defects in a wafer produced by a process, the method comprising the steps of:

providing a first and second reticle plates that are spaced apart and substantially parallel;

providing a first electronic test pattern on the first reticle plate and a second electronic test pattern on the second reticle plate, with each electronic test pattern comprising a sequence of repeating subpatterns, with each sub-pattern comprising an array of die size patterns and with each die size pattern comprising an array of micro-patterns, where each micropattern on the first reticle plate lies closest to and directly opposite at least one corresponding micro-pattern on the second reticle plate, and where, for a micro-pattern on the first reticle plate and the corresponding micro-pattern on the second reticle plate, at least one of these micro-patterns includes an electrically conductive pattern and an electrical contact pad for activating this electrically conductive pattern;

providing an electrically insulating layer of material between the first and second reticle plates;

choosing each micro-pattern on the first reticle plate and the corresponding micro-pattern on the second reticle plate to test for the presence of defects in one of the unit processes that comprise the manufacturing process;

activating the electrically conductive pattern or patterns for each pair of corresponding micro-patterns on the first and second reticle plates; and identifying the defects in each unit process according to the pairs of corresponding micro-patterns that are found to be inoperative when activated.

2. The method of claim 1 further defined by forming one of said micro-patterns from a double horizontal comb under a plate.

3. The method of claim 1 further defined by forming one of said micro-patterns from a horizontal raster under a plate.

4. The method of claim 1 further defined by forming one of said micro-patterns from a plate under a double horizontal comb.

5. The method of claim 1 further defined by forming one of said micro-patterns from a plate under a plate.

6. The method of claim 1 further defined by forming one of said micro-patterns from a single plate.

7. The method of claim 1 further defined by forming one of said micro-patterns from a vertical serpentine under a plate.

8. The method of claim 1 further defined by forming one of said micro-patterns from a double vertical comb under a double horizontal comb.

9. The method of claim 1 further defined by forming one of said micro-patterns from a vertical raster under a horizontal raster.

10. The method of claim 1 further defined by forming one of said micro-patterns from a double vertical digitated comb under a plate.

11. A method of testing unit processes of an integrated circuit manufacturing series for random defects, where the unit processes are used for manufacturing wafers carrying integrated circuits, the method comprising the steps of:

(a) simulating multi-level wires of an integrated circuit with electrically conductive first and second layers separated by a dielectric layer, where the conductive layers are established in first and second micro-patterns, respectively;

(b) simulating other multi-level conductive first and second layers separated by a dielectric layer, where the conductive layers are established in a plurality of micro-patterns, with the plurality of micro-patterns forming die size patterns within a sub-pattern;

(c) providing a test pattern on a wafer by repeating the test patterns over substantially all of the surface of the wafer;

(d) fabricating the test pattern in a unit process in a similar manner as a wafer carrying integrated circuits is treated in the unit process; and (e) testing micro-structures formed by the micro-patterns for failure.

12. The method of claim 11 further defined forming a micro-pattern with a single conductive plate.

13. The method of claim 11 wherein said testing is by detecting opens and shorts in said conductive layers.

14. The method of claim 11 wherein said conductive layers are formed by conductive lines having line widths which simulate the line widths of said integrated circuits.

15. The method of claim 11 wherein said conductive layers are formed by conductive lines having spacings between lines which simulate the spacing between the lines of said integrated circuits.

16. The method of claim 11 further defined by separating repeating from non-repeating defects and identifying nonrepeating defects as random defects.

17. The method of claim 11 further defined by repeating steps (a)-(e) for other unit processes.

18. The method of claim 11, further comprising the step of forming vias extending from said first layer to said second layer through said dielectric layer.

* * * * *